(12) United States Patent
Street

(10) Patent No.: US 11,293,804 B2
(45) Date of Patent: Apr. 5, 2022

(54) OPTICAL SENSOR SYSTEM TO IDENTIFY OBJECTS AND THEIR MOVEMENT

(71) Applicant: Palo Alto Research Center Incorporated, Palo Alto, CA (US)

(72) Inventor: Robert Anthony Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/726,409

(22) Filed: Dec. 24, 2019

(65) Prior Publication Data

US 2021/0190591 A1   Jun. 24, 2021

(51) Int. Cl.
*G01J 3/51* (2006.01)
*H01L 27/146* (2006.01)

(52) U.S. Cl.
CPC .......... *G01J 3/513* (2013.01); *H01L 27/1461* (2013.01); *H01L 27/14616* (2013.01); *H01L 27/14621* (2013.01); *H01L 27/14623* (2013.01); *H01L 27/14629* (2013.01); *H01L 27/14645* (2013.01)

(58) Field of Classification Search
CPC .......... G01J 3/513; H01L 27/1461; H01L 27/14616; H01L 27/14621; H01L 27/14623; H01L 27/14629; H01L 27/14645
See application file for complete search history.

(56) References Cited

U.S. PATENT DOCUMENTS

| | | | |
|---|---|---|---|
| 5,101,285 A | * | 3/1992 | Kawai ................ H04N 1/02865 250/208.1 |
| 9,928,698 B2 | | 3/2018 | Farrow et al. |
| 9,996,818 B1 | | 6/2018 | Ren et al. |
| 10,007,266 B2 | | 6/2018 | Fischer et al. |
| 10,062,050 B2 | | 8/2018 | Lipsey et al. |
| 10,130,195 B2 | | 11/2018 | Phillips et al. |
| 10,318,569 B1 | | 6/2019 | Funk et al. |
| 10,474,858 B2 | | 11/2019 | Davis et al. |
| 2002/0075525 A1 | * | 6/2002 | Lichtfuss ............. H04N 1/0316 358/475 |
| 2004/0252867 A1 | * | 12/2004 | Lan ...................... G06K 9/0004 382/124 |
| 2016/0033328 A1 | * | 2/2016 | Walters ................ G01J 3/0208 356/327 |
| 2017/0085813 A1 | * | 3/2017 | Reinhold ............. H04N 5/2354 |
| 2018/0060622 A1 | | 3/2018 | Pilzner et al. |

(Continued)

OTHER PUBLICATIONS

Street, R.A. et al., "Two Dimensional Amorphous Silicon Image Sensor Arrays", Mat. Res. Soc. Symp. Proc. vol. 377, 1995, Materials Research Society.

*Primary Examiner* — Jamil Ahmed
(74) *Attorney, Agent, or Firm* — Fox Rothschild LLP

(57) ABSTRACT

A system of optical sensors determines whether an object is placed on the system by passing light through the sensor layer, detecting light reflected from the object above the sensor layer, and identifying the object based on whether a color detected in the light corresponds to a color of the side of the object that is positioned on the system over the sensor layer. When the system includes multiple optical sensor units, the system may determine where the object has been placed by determining which of the sensor units detect light reflected from the side of the object.

32 Claims, 7 Drawing Sheets

(56) References Cited

U.S. PATENT DOCUMENTS

| | | | |
|---|---|---|---|
| 2018/0235456 A1* | 8/2018 | Karakaya | A61B 5/6821 |
| 2019/0073627 A1 | 3/2019 | Nakdimon et al. | |
| 2019/0080139 A1* | 3/2019 | Reinhold | G06K 9/0004 |
| 2019/0303848 A1 | 10/2019 | Schoening | |
| 2019/0304238 A1 | 10/2019 | Ambauen et al. | |
| 2019/0371861 A1* | 12/2019 | Kim | H01L 27/14621 |
| 2020/0103346 A1* | 4/2020 | Zhang | G01N 21/6428 |

\* cited by examiner

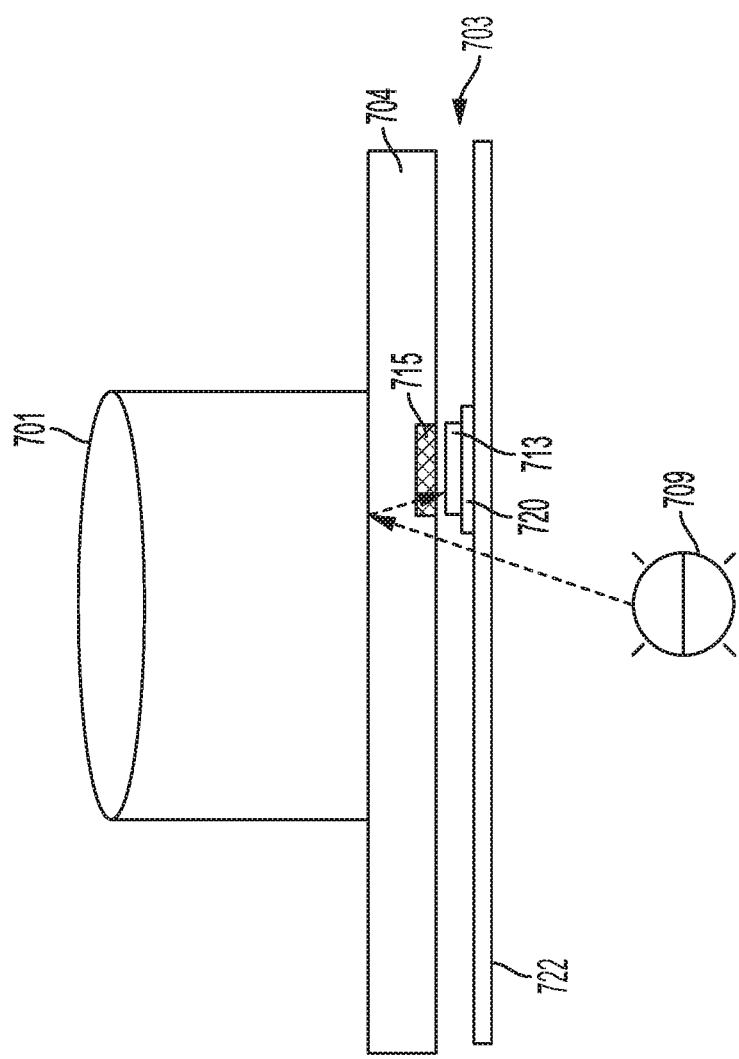

OPTICAL SENSOR SYSTEM TO IDENTIFY OBJECTS AND THEIR MOVEMENT

BACKGROUND

It is of value to automatically detect and electronically record when an item is removed from and/or placed on a storage location, such as a shelf. For example, to assist with inventory management and customer engagement, retail store operators desire to identify when a customer removes a product from a store shelf. It is also useful for retail operators to know if the product has been returned to the shelf, or moved to an unexpected location. Warehouse operators, pharmacies, medical and dental service providers and other industries also have a keen interest in identifying when products have been removed from and/or placed on a storage location.

While inventory control systems currently exist, they typically require that the product or its packaging be equipped with a tag, such as a radio frequency identification (RFID) tag that communicates with a receiver that can detect when the tag is within transmission range of the receiver. This increases the cost of a product and its packaging, and it also requires the retail store operator (or other storage facility operator) to coordinate with each product's manufacturer so ensure that each product includes a tag that communicates using a protocol that can be detected and understood by the facility operator's receivers. Other inventory control systems require weight sensors and/or cameras with image processing software, each of which can be expensive and cumbersome to implement.

This document describes a novel method and system that is directed to solving at least some of the technical problems described above, and/or additional issues.

SUMMARY

In various embodiments, a system is configured to detect absence or presence or absence of an object over a substrate. The system includes the substrate, which includes a sensor layer with one or more sensor units. The sensor layer includes a first side, along with a second side that is opposite the first side. Each sensor unit includes two or more optical sensors, at least a first one of which will be aligned with a color filter of a first color, and at least a second one of which aligned with a color filter of a second color. Each of the optical sensors is positioned to detect light that is received through the second side of the sensor layer. The system includes a circuit that is electrically connected to each of the optical sensors and that is configured to, when an illumination source directs light into the first side of the sensor layer, past the optical sensors and through the second side of the sensor layer: (i) receive signals from the optical sensors; and (ii) use the received signals to generate an output that indicates whether an object of a particular color is placed over the sensor unit.

Optionally, in each sensor unit, a first optical sensor may be aligned with a red color filter, a second optical sensor may be aligned with a blue color filter, a third optical sensor may be aligned with a green color filter, and a fourth optical sensor may be aligned with a white or gray reflecting layer. The optical sensors of each sensor unit may be spaced apart, with transparent or translucent areas between the optical sensors to permit light from the illumination source to pass between the optical sensors through the sensor layer.

The substrate also may include a spacer layer positioned along the second side of the sensor layer. The spacer layer may have a thickness that is equal to or greater than a thickness of the sensor layer.

Optionally, each of the optical sensors may include an amorphous silicon p-i-n photodiode. In addition, each sensor unit may include a transistor that comprises an amorphous silicon thin film transistor (TFT), a metal oxide semiconductor TFT, a polysilicon thin film transistor, or a printed organic TFT. Optionally, each sensor unit may include transistors, each of which includes a first source or drain electrode that is electrically connected to one of the optical sensors, along with a second source or drain electrode that is electrically connected to an output of the sensor unit.

Optionally, the sensor layer also may include a transparent or translucent substrate. The sensor layer also may include any number of metallic contacts, each of which is positioned between the substrate and one of the optical sensors.

The circuit may include a processor that is electrically connected to outputs of each of the optical sensors. The system also may include the illumination source, positioned to direct light toward the first side of the sensor layer.

During operation, when the object of the particular color is placed on the sensor unit and the illumination source is active, the illumination source will direct light toward a side of the object that exhibits the particular color. The light that is received through the second side of the sensor layer will be, and the optical sensors will detect, light that is reflected from the side of the object. The circuit that uses the received signals to generate the output that indicates whether or not the object of a particular color is placed over the sensor unit may then do so based on whether the optical sensors determine that light of the particular color has been reflected from the side of the object that exhibits the particular color.

In some embodiments, the sensor layer may include an array of sensor units. If so, then the circuit may be electrically connected to each of the sensor units. The circuit may, when an illumination source directs light into the first side of the sensor layer, past the optical sensors and through the second side of the sensor layer, receive signals from the optical sensors of each sensor unit. The circuit may then use the received signals to generate an output that, for each of the sensor units: (i) indicates whether an object is placed over that sensor unit; and (ii) when an object is placed over that sensor unit has been detected, identifies a color of the object that is placed over the sensor unit.

In other embodiments, in a method of detecting presence or absence of an object of a particular color on a substrate, the substrate is provided to include a sensor layer having a first side, an opposite second side, and one or more sensor units that each include a plurality of optical sensors. In each sensor unit, at least a first optical sensor is aligned with a color filter of a first color, and at least a second optical sensor is aligned with a color filter of a second color. A transparent or translucent area is positioned between the optical sensors. Other optional features of the system are discussed in the paragraphs above. When light is passed from the first side of the substrate through the transparent or translucent area to the second side of the substrate, the optical sensors will generate signals that are responsive to light reflected from an object that is positioned over the sensor unit. A circuit that is electrically connected the optical sensors will receiving the signals from the optical sensors, analyze the signals to identify a color in the reflected light, and determine whether the color in the reflected light corresponds to a particular color. If the color in the reflected light corresponds to the particular color, the system will determine that an object of the particular color is positioned over the sensor unit on the second side of the substrate; otherwise the system will determine that an object of the particular color is not positioned over the sensor unit on the second side of the substrate. If multiple sensor units are available, the circuit may make this determination for each sensor unit and thus determine which sensor unit(s) have objects of the particular color placed over them.

Optionally, when the system analyzes the signals to identify the color in the reflected light, the system may determine whether the signal received from each of the optical sensors is low or high, and then determine the color of the reflected light as a color that corresponds to a combination of the color filters that are aligned with optical sensors that have emitted a high signal.

BRIEF DESCRIPTION OF THE DRAWINGS

FIG. 7 illustrates an example photodiode structure.

DETAILED DESCRIPTION

Figure 1:
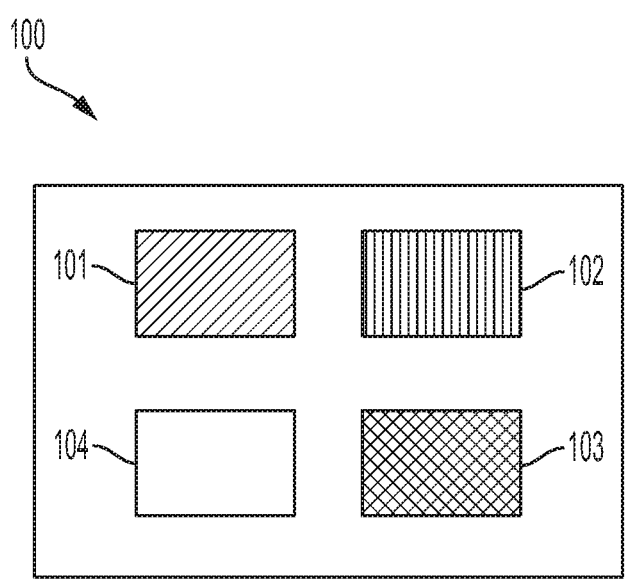
FIG. 1 illustrates an example sensor unit that includes a set of optical sensors.

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" (or "comprises") means "including (or includes), but not limited to." When used in this document, the term "exemplary" is intended to mean "by way of example" and is not intended to indicate that a particular exemplary item is preferred or required.

In this document, when terms such "first" and "second" are used to modify a noun, such use is simply intended to distinguish one item from another, and is not intended to require a sequential order unless specifically stated. The term "approximately," when used in connection with a numeric value, is intended to include values that are close to, but not exactly, the number. For example, in some embodiments, the term "approximately" may include values that are within +/−10 percent of the value.

In this document, the term "connected", when referring to two physical structures, means that the two physical structures touch each other. Devices that are connected may be secured to each other, or they may simply touch each other and not be secured.

When used in this document, terms such as "top" and "bottom," "upper" and "lower", or "front" and "rear," are not intended to have absolute orientations but are instead intended to describe relative positions of various components with respect to each other. For example, a first component may be an "upper" component and a second component may be a "lower" component when a device of which the components are a part is oriented in a first direction. The relative orientations of the components may be reversed, or the components may be on the same plane, if the orientation of the structure that contains the components is changed. The claims are intended to include all orientations of a device containing such components.

Additional terms that are relevant to this disclosure will be defined at the end of this Detailed Description section.

This document describes a system that is able to detect when a product has been placed on or removed from a particular location on a shelf or other storage structure. In this document, we will use the term "shelf" by way of example as a storage structure. However, the system also may be implemented for other storage structures such as drawers, walls on which items (such as pictures) are hung, floors on which products are placed, and other physical structures on or against with a product may be placed. In addition, this description may use location-descriptive terms such as "on", "over" or "under" to refer to relative locations with respect to a storage structure. When the structure is a horizontal structure such as a shelf or floor, then terms such as "on" and "over" will mean that the item is positioned on or over the structure, and "under" will mean under the structure. However, when the structure is a wall or other vertical structure against which the item is placed, then "on" or "over" refers to a side of the structure against which the item rests, while "under" refers to the opposite side of the structure.

The system includes a set of optical sensors that are arranged in an array or other arrangement and positioned on or in the shelf, wall, floor or other storage structure. Each product is positioned over a sensor unit, and the system may include an array of sensor units, each of which is positioned on a location that corresponds to the expected location of a product when placed on the structure. When a product is placed on the shelf over the sensor unit, light will pass through the shelf to the product, and reflect back on the sensor unit. If no product is on the shelf, then light will not reflect back to the sensor unit but instead the sensor unit will only detect ambient light above the shelf. The sensor unit will then generate a signal that indicates the color of the product (if any) that is positioned over the sensor unit over the shelf. A processor may analyze this signal to determine whether the detected color matches an expected color of a product that is to be placed on the shelf.

The examples below will show products having similar sizes and a particular bottom shape. However, the system can accommodate other situations with a variety of sized and shaped products.

FIG. 1 illustrates an example of a sensor unit 100 having a set of optical sensors 101-104. At least a two of the optical sensors will be aligned with color filters so that a color filter is positioned over each of the sensors. For example, in the sensor unit 100 shown in FIG. 1, the first optical sensor 101 may be aligned with a red color filter. The second optical sensor 102 may be aligned with a blue color filter. The third optical sensor 103 may be aligned with a green color filter. The fourth optical sensor 104 may be aligned with a white, gray or no color filter. Other colors, and fewer or more optical sensors, may be used in various embodiments, although the use of primary colors red, green and blue in the filters is desirable for applications in which a variety of colors must be detected as it renders the sensor unit useful for identifying a wide variety of reflected colors across the color spectrum. In addition, while the sensor unit shows the sensors positioned in a 2×2 array, other arrangements are possible so long as the sensors are spaced far enough apart from each other to permit light to pass between the optical sensors to a spacer layer as will be described below. Optionally, the sensor unit also may include one or more additional optical sensors that are configured to measure illumination intensity, as will be described below in the discussion of FIG. 2.

Figure 2:
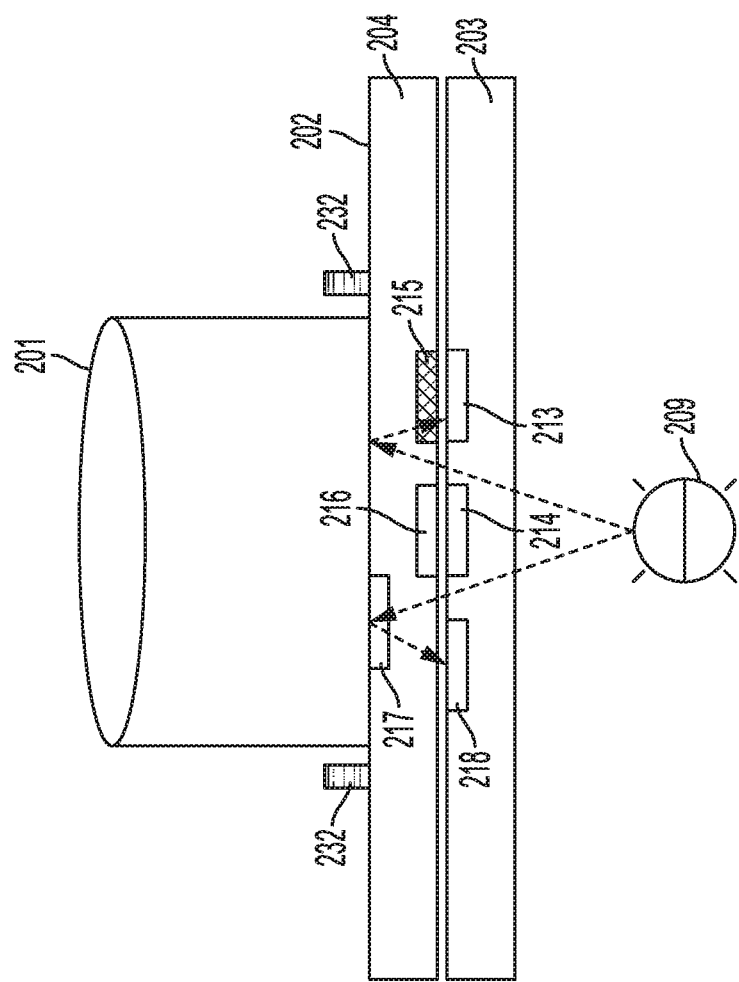
FIG. 2 illustrates an example system that may be installed in a storage structure for sensing the presence of an object on the storage structure.

FIG. 2 illustrates an example system for detecting the presence or absence of an object on a storage structure. In FIG. 2, the object 201 is placed on a shelf 202. The shelf 202 includes a sensor layer 203 containing one or more sensor units, each of which is positioned under an expected object location. In FIG. 2, the expected object location is denoted by the space between location guides 232, which may be features such as one or more sidewalls, printed markings on the shelf, guide wires or other structures or markings that will assist a user in determining where to place the object 201 on the shelf 202. However, the location guides 232 are optional and are not a requirement of the system. The shelf 202 also includes a spacer layer 204 that is positioned along a first side (i.e., over) the sensor layer 203, between the sensor layer 203 and the shelf face on which the object 201 is placed. The system also includes an illumination source 209 that is positioned along (e.g., under) a second side of the spacer layer 203. As shown in FIG. 2, the side of the spacer layer 203 along which the illumination source is positioned is opposite the side of the spacer layer 203 along which the spacer layer 204 is positioned.

Each sensor unit includes two or more optical sensors 213, 214. Although only two of the optical sensors are shown in FIG. 2, the example sensor unit may include another number of optical sensors (as the four sensor embodiment of FIG. 1, arranged in a 2×2 array). Any or all of the optical sensors 213, 214 may be aligned with a color filter 215, 216 so that each color filter is positioned over a corresponding optical sensor. In the example shown, optical sensor 213 is aligned with color filter 215, while optical sensor 214 is aligned with color filter 216. The color filters 215, 216 may be positioned in the spacer layer 204 as shown in FIG. 2, or alternatively they may be positioned over their corresponding optical sensors 213, 214 in the sensor layer 203.

Each of the sensor layer 203 and the spacer layer 204 will be transparent or translucent so that light from the illumination source 209 may pass through the layers (and past the optical sensors of the sensor layer), reflect off of the underside of the object 201, and be directed back to the optical sensors 213, 214. The sensor layer 203 and the spacer layer 204 may be comprised of different materials or of a common material, and they may be two separate layers or a single layer as shown. For example, the spacer layer 204 may be formed of a clear plastic material, having a thickness that is at least as large as the thickness of the optical sensors (such as approximately 1 mm to approximately 2 mm). Optionally, in some embodiments, the sensor layer 203 may simply include the sensor units, attached to or positioned under the bottom of the spacer layer 204 with no other supporting structure. The optical sensors 213, 214 of each sensor unit will be spaced apart from each other so that light from the illumination source 209 may pass between the optical sensors to the spacer layer 204.

In operation, light from illumination source 209 will pass into the first side of the sensor layer 203, out the second side of the sensor layer 203, and through the spacer layer 204 if present. The optical sensors 213, 214 of the sensor unit will detect light received from above the shelf 202 and each generate a signal having characteristics that a processor can use to determine the color of an object (if any) that is positioned over the shelf. The light detected by the optical sensors 213, 214 may be light that originated from the illumination source that passed through the sensor layer 203 and returned to the sensor layer 203 after reflecting off of the object 201. Or, if no object is over the sensor unit, the optical sensors 213, 214 may detect ambient light or no light. For example, if a first optical sensor 214 is aligned with a green filter 216 and a second optical sensor 213 is aligned with a blue filter 215, then the signal emitted by the first optical sensor 214 will be active (i.e. reflected light will be detected) and the signal emitted by the second optical sensor 213 will be inactive (i.e. no reflected light) when a green object is placed on the shelf. When the green object is removed from the shelf, the activity of the sensors will change, allowing the system to determine that the green object has been removed. For example, when the green object is removed from the shelf the optical sensors 213, 214 will no longer provide signals corresponding to the green reflected light. Instead the sensors become exposed to ambient light and their signals will correspond to this different illumination. The changes in the sensor signals allow the system to determine that the object is removed.

The sensor unit also may include an additional optical sensor 218 that is aligned with a white reflector 217. The additional optical sensor 218 may serve as a calibration sensor to measure the intensity of the illumination.

The illumination source 209 may be any suitable light source, such as one or more light emitting diodes, a halogen or other type light bulb that emits white light, or even ambient light of the facility in which the storage structure is located.

Figure 3:
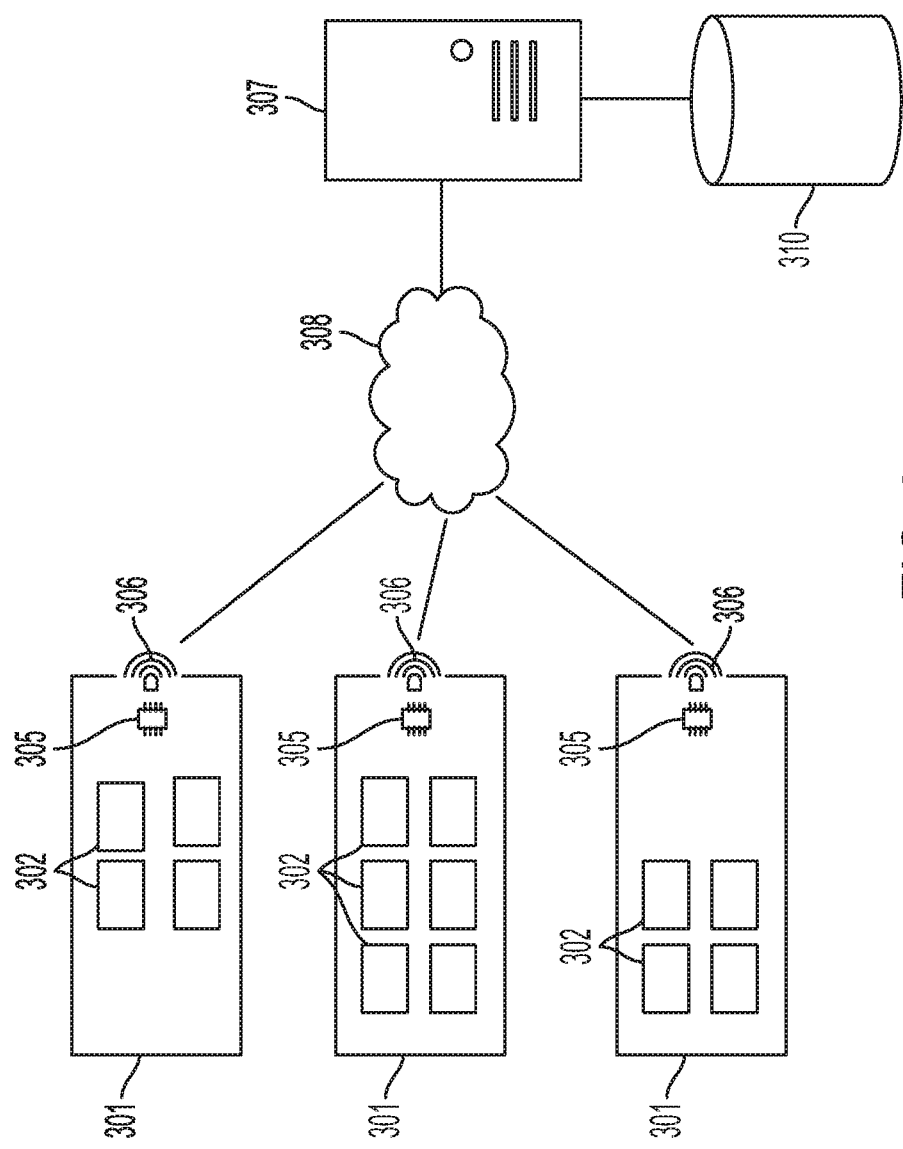
FIG. 3 illustrates a system that includes multiple storage structures that are in communication with a remote processor.

FIG. 3 illustrates that a facility with multiple shelves 301 (or other storage structures) may include multiple sensor units 302. In fact, each individual shelf may include multiple sensor units 302. The optical sensors of each sensor unit will be electrically connected via wires, conductive traces, or other conductive structures to a circuit that is configured to receive the signals from the optical sensors, determine the color that the optical sensors are detecting, and generate an output that indicates whether or not an object is positioned over the sensors. If the color detected by any sensor unit matches an expected color, the system will determine that the object is positioned over the sensor unit. If not, the system will determine that the object is not located at the position. The circuit may include one or more components that are integral with the storage structure, and optionally one or more components that are located remotely from the storage structure but in communication with components in the storage structure. For example, the storage structure may include an integral processor 305 that performs the detection and determination functions. The processor may be, for example, a microprocessor or a component of a microcontroller. Alternatively or additionally, the circuit may include a transmitter 306 by which the storage structure will transmit the sensors' output and/or the processor's output to a remote processor 307, such as a local or cloud-based server, either directly or via communication paths along one or more communication networks 308.

The local processor 305 or remote processor 307 may continuously monitor the sensor readout from optical sensors. Alternatively, the processor may initiate monitoring on a periodic basis, or in response to a triggering action such as a command or request to provide information about a shelf's contents. The processor may combine the response from the optical sensors to determine the color on the base of the product. The system may then access a data store 310 of stored inventory information to determine, based on one or more criteria such as time and/or location, a color of the product that is expected to be located on the shelf at the current time. If the color expected matches the color that is detected, the processor may return an indication that the expected product is on the shelf, above the sensor unit. If the expected color is not detected, the processor may return an indication that the expected product is not at its expected location.

In various embodiments, the optical sensors may be any photosensitive sensing devices. For example, the sensors may be photodiodes, such as amorphous silicon (A-Si) p-i-n (PIN) photodiodes. A-Si photodiodes are sensitive across the visible spectrum and have wide dynamic range, which can be valuable attributes for the device.

Figure 4:
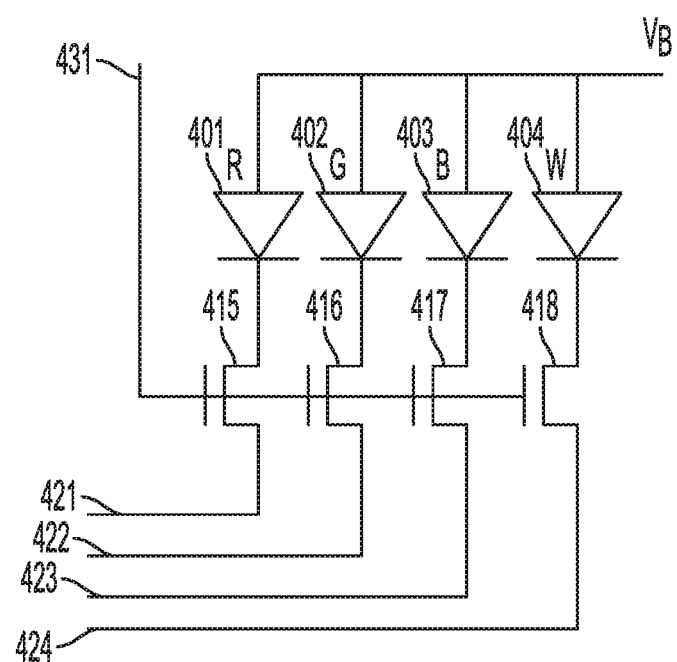
FIG. 4 illustrates an example matrix addressing arrangement.

Each photodiode of each sensor unit may be electrically connected to an addressing transistor, and addressed using a matrix addressing arrangement such as is known in the art. For example, referring to FIG. 4, the n column of each photodiode 401-404 may be connected to the gate of a corresponding thin film transistor (TFT) 415-418. For each transistor (e.g., 415), one of the TFT's source-drain electrodes is electrically connected to a photodiode (e.g., 401) and the other of the TFT's source-drain electrodes is electrically connected to a corresponding output 421-424. In various embodiments, the transistors may be fabricated from amorphous silicon, polysilicon, printed organic, metal oxide or other semiconductors. Other addressing arrangements such as direct addressing of each photodiode by the microcontroller may be used.

The photodiodes 401-404 may have a reverse bias voltage such as 0-5 volts. A gate addressing line 431 is used so that the signal of each photodiode is read out by addressing each gate line in sequence with a voltage pulse to turn the gate on (such as approximately 10 to approximately 20 volts), while the other gate lines are turned off (typically approximately 0 to approximately −5 volts.

Figure 5:
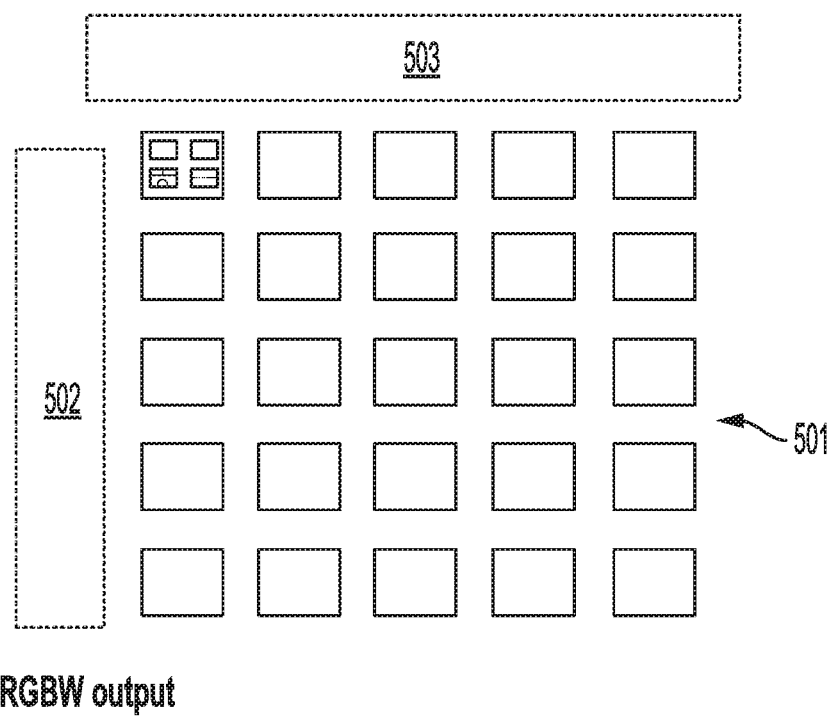
FIG. 5 illustrates a system that may address and read outputs from multiple sensor units.

For multiple sensor units, such as the 5×5 array of sensor units 501 shown in FIG. 5, the gate addressing sequence could be accomplished with a shift register 502, or by individual contacts of a microprocessor controller so long as the number of gates does not exceed the number of available contacts of the microprocessor. Similarly, the outputs could be selected by a multiplexer 503, or by individual contacts to a controller. The gate pulse length could be chosen to read out the entire array in a designated time, such as a time that is the product of the number of gates and the gate pulse period.

Figure 6:
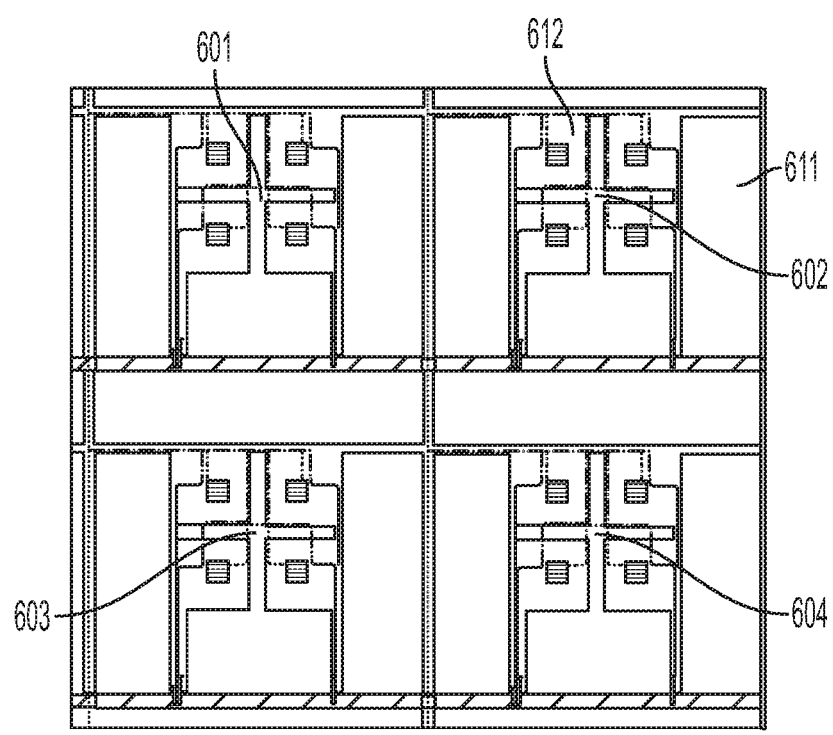
FIG. 6 illustrates an example arrangement of four sensor units in a sensor layer, with corresponding electrical connections.

FIG. 6 illustrates an example sensor layer that includes of a group of four sensor units 601-604, each of which includes four photodiodes, and their corresponding electrical interconnects. Translucent or transparent areas 612, denoted by the white spaces within the crosshatched areas in FIG. 6, enable light to pass through the sensor layer to reflect off of the placed object. Optional opaque areas 611, denoted by the crosshatched areas in FIG. 6, prevent illumination where it is not required. FIG. 7 illustrates how a photodiode 713 of the sensor layer 703 may be fabricated with an opaque metallic bottom contact 720, which in turn rests on a substrate 722x. The opaque contact prevents the illumination source 609 from directly illuminating the sensor through the bottom contact. Instead light from the illumination source 709 reflects off the bottom of the object 701, through the spacer layer 704 and filter 715, where light corresponding to the color of the filter will reach the photodiode 713.

When red, green and blue (R, G, B) filtered optical sensors are used, the three color sensors generate signals corresponding to the reflection of light from the base of the product. The signal can be normalized to the signal from the fourth photodiode which is reflected off the white (or grey) reflector. The color detected may correspond to a combination of the color filters that are aligned with optical sensors that have emitted a high signal. As a simple example with a 1-bit signal, if the optical sensor that is aligned with a red filter emits a high signal while the other filters emit a low signal or no signal, the system may determine that the color of the light (and thus the color of the object above the sensor unit) is red. If the optical sensors having blue and red filters emit high signals, the system may determine that an object positioned above the sensor unit is purple. Optionally, the reflector may scatter light rather than provide specular reflection. The signals can be calibrated by measurement of a white, black and/or other color base. Thus, the system can detect the color of an object based over the sensor unit based on the color of reflected light, as detected by the each of the color-filtered optical sensors.

The number of unique colors that the system can detect may vary based on the signal-to-noise of the sensor output and the recording electronics. For example, a 1-bit signal, in which the controller determines whether the individual photodiode signals are low or high (zero or 100%) as described in the example of the previous paragraph, can identify 8 unique colors. The R, G and B signals will have output values such as (1, 1, 0) or (0, 1, 0) to represent the colors. A 2-bit signal can identify 16 unique colors and requires a 3 level measurement resolution (0, 50% and 100%), giving color representations such as (1, 0.5, 0), and so on for higher resolutions.

The ability to sense multiple colors allows the type of objects placed on the shelf to be identified. One side of each object, typically the base, may be colored such that objects of the same type have the same color and objects of a different type have a different color. The colors are selected to have known components of red, green and blue, as is known in the art, so that the output values of the sensors in a sensor unit can identify the color. The microcontroller unit that operates the system can contain the correspondence between color and object type, and hence the object type can be identified. The system can therefore determine the presence or absence of an object at a specific location on the sensor array, and if an object is present the system can determine the object's type.

The system may scan the sensor array repeatedly at a designated repeat frequency, or in response to commands to scan the array, and record the data from all the sensor units. The signals generated by the photodiodes may be interpreted by a computing system such as a microprocessor controller unit that has a central processing unit (CPU), memory and input/output channels. The input channels may need analog-to-digital converters to convert the analog output signal of sensor to a digital input signal for the CPU. The controller may use the data to identify all the products that positioned over the sensor units using a previously established data set of colors, and the data will show whether an item of an expected color has been removed since the previous array scan. The data can be arranged to be displayed on a screen or if an object has been picked up, pre-determined relevant information can be displayed for a user. The data can also be transmitted is suitable form an external system for analysis.

While the examples shown and discussed in this Detailed Description use the example of a product placed on a shelf as in a retail store, it is to be understood that the disclosed embodiments can be applied to any location where it is desirable to monitor whether an object is absent or present on a storage structure. For example, the system may be incorporated into storage structures such as display cases, pharmacy shelves, storage drawers, tool carriers, medical equipment cards, walls that display artwork, floors of vehicle parking facilities, and a wide variety of other locations.

Terminology that is relevant to this disclosure includes:

The terms "processor" and "processing device" refer to a hardware component of an electronic device that is configured to execute programming instructions. Except where specifically stated otherwise, the singular terms "processor" and "processing device" are intended to include both single-processing device embodiments and embodiments in which multiple processing devices together or collectively perform a process.

The terms "memory," "memory device," "data store," "data storage facility" and the like each refer to a non-transitory device on which computer-readable data, programming instructions or both are stored. Except where specifically stated otherwise, the terms "memory," "memory device," "data store," "data storage facility" and the like are intended to include single device embodiments, embodiments in which multiple memory devices together or collectively store a set of data or instructions, as well as individual sectors within such devices.

In this document, the terms "communication link" and "communication path" mean a wired or wireless path via which a first device sends communication signals to and/or receives communication signals from one or more other devices. Devices are "communicatively connected" if the devices are able to send and/or receive data via a communication link. "Electronic communication" refers to the transmission of data via one or more signals between two or more electronic devices, whether through a wired or wireless network, and whether directly or indirectly via one or more intermediary devices.

In this document, the term "imaging device" refers generally to a hardware sensor that is configured to acquire digital images. An imaging device may capture still and/or video images, and optionally may be used for other imagery-related applications. For example, an imaging device can be held by a user such as a DSLR (digital single lens reflex) camera, cell phone camera, or video camera. The imaging device may be part of an image capturing system that includes other hardware components. For example, an imaging device can be mounted on an accessory such as a monopod or tripod. The imaging device can also be mounted on a transporting vehicle such as an aerial drone, a robotic vehicle, or on a piloted aircraft such as a plane or helicopter having a transceiver that can send captured digital images to, and receive commands from, other components of the system.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. A system for detecting presence or absence of an object, the system comprising:
   a sensor layer comprising one or more sensor units, each of which comprises a plurality of optical sensors, wherein:
      the sensor layer comprises a first side, and a second side that is opposite the first side,
      a first of the optical sensors in each sensor unit is aligned with a color filter of a first color,
      a second of the optical sensors in each sensor unit is aligned with a color filter of a second color, and
      each of the optical sensors is positioned to detect light that is received through the second side of the sensor layer; and
   a circuit that is electrically connected to each of the optical sensors and that is configured to, when an illumination source directs light into the first side of the sensor layer, past the optical sensors and through the second side of the sensor layer:
      receive signals from each of the plurality of optical sensors,
      use the received signals from each of the plurality of optical sensors to generate an output that indicates a color, wherein the color correlates to a surface color of an object and
      if the color corresponds to a predetermined surface color, determine that the object is placed over the sensor unit, otherwise not determine that the object is placed over the sensor unit.

2. The system of claim 1, wherein the optical sensors of each sensor unit comprise:
   the first optical sensor, aligned with a red color filter;
   the second optical sensor, aligned with a blue color filter;
   a third optical sensor, aligned with a green color filter; and
   a fourth optical sensor, aligned with a white or gray reflecting layer.

3. The system of claim 1, wherein the optical sensors of each sensor unit are spaced apart with transparent or translucent areas between the optical sensors to permit light from the illumination source to pass between the optical sensors through the sensor layer.

4. The system of claim 1, further comprising a spacer layer positioned along the second side of the sensor layer, wherein the spacer layer has a thickness that is equal to or greater than a thickness of the sensor layer.

5. The system of claim 1, wherein each of the optical sensors comprises an amorphous silicon p-i-n photodiode.

6. The system of claim 1, wherein each sensor unit further comprises a transistor that comprises:
   an amorphous silicon thin film transistor (TFT);
   a metal oxide semiconductor TFT;
   a polysilicon thin film transistor; or
   a printed organic TFT.

7. The system of claim 1, wherein the sensor layer further comprises:
   a transparent or translucent substrate; and
   a plurality of opaque metallic contacts, each of which is positioned between the substrate and one of the optical sensors.

8. The system of claim 1, wherein each sensor unit comprises a plurality of transistors, each of which comprises:
   a first source or drain electrode that is electrically connected to one of the optical sensors; and
   a second source or drain electrode that is electrically connected to an output of the sensor unit.

9. The system of claim 1, wherein the circuit comprises a processor that is electrically connected to outputs of each of the optical sensors.

10. The system of claim 4, wherein each of the color filters is positioned in the sensor layer or in the spacer layer.

11. The system of claim 1, further comprising the illumination source, positioned to direct light toward the first side of the sensor layer.

12. The system of claim 11, wherein, during operation, when the object is placed on the sensor unit:
the illumination source, when active, will direct light toward a side of the object;
the light that is received through the second side of the sensor layer will be, and the optical sensors will detect, light that is reflected from the side of the object; and
the circuit that uses the received signals to generate the output that indicates the color will do so based on whether the optical sensors determine that light of the predetermined surface color has been reflected from the side of the object.

13. A system for detecting and identifying objects, the system comprising:
a sensor layer comprising a first side, a second side that is opposite the first side, and an array of sensor units, wherein each of the sensor units comprises a plurality of optical sensors and, in each of the sensor units:
each of the optical sensors is positioned to detect light that is received through the second side of the sensor layer;
a first of the optical sensors is aligned with a color filter of a first color, and
a second of the optical sensors is aligned with a color filter of a second color; and
a circuit that is electrically connected to each of the sensor units and that is configured to, when an illumination source directs light into the first side of the sensor layer, past the optical sensors and through the second side of the sensor layer:
receive signals from each of the plurality of optical sensors of each sensor unit,
use the received signals to generate an output that indicates a color, wherein the color correlates to a surface color of an object, and
if the color corresponds to a predetermined surface color, determine that the object is placed over that sensor unit,
otherwise determine that the object is not placed over the sensor unit.

14. The system of claim 13, wherein the optical sensors of each sensor unit comprise:
the first optical sensor, aligned with a red color filter;
the second optical sensor, aligned with a blue color filter;
a third optical sensor, aligned with a green color filter; and
a fourth optical sensor, aligned with a white or gray reflecting layer.

15. The system of claim 13, wherein the optical sensors of each sensor unit are spaced apart with transparent or translucent areas between the optical sensors to permit light from the illumination source to pass between the optical sensors through the sensor layer.

16. The system of claim 13, further comprising a spacer layer positioned along the second side of the sensor layer, wherein
the spacer layer has a thickness that is equal to or greater than a thickness of the sensor layer.

17. The system of claim 13, wherein:
each of the optical sensors comprises an amorphous silicon p-i-n photodiode; and
each sensor unit further comprises a transistor that comprises:
an amorphous silicon thin film transistor (TFT),
a metal oxide semiconductor TFT,
a polysilicon TFT, or
a printed organic TFT.

18. The system of claim 13, wherein the sensor layer further comprises:
a transparent or translucent substrate; and
a plurality of opaque metallic contacts, each of which is positioned between the substrate and one of the optical sensors.

19. The system of claim 13, wherein each sensor unit comprises a plurality of transistors, each of which comprises:
a first source or drain electrode that is electrically connected to one of the optical sensors of the sensor unit; and
a second source or drain electrode that is electrically connected to an output of the sensor unit.

20. The system of claim 16, wherein each of the color filters is positioned in the sensor layer or in a spacer layer that is positioned along the sensor layer.

21. The system of claim 13, further comprising the illumination source positioned to direct light toward the first side of the sensor layer.

22. The system of claim 13, wherein, during operation:
the illumination source, when active, will direct light through transparent or translucent areas of the sensor layer;
the optical sensors of each sensor unit will determine whether light has been reflected from the side of an object that has been placed over the sensor unit; and
for any sensor unit over which an object has been placed, the optical sensors of the sensor unit will detect light reflected from the object, and the received signals will identify the color of the object based on color of the light reflected from the object.

23. A method of detecting presence or absence of an object of a predetermined surface color on a substrate, the method comprising:
providing a substrate that includes a sensor layer comprising:
a first side and an opposite second side,
a sensor unit that comprises a plurality of optical sensors, wherein:
a first of the optical sensors is aligned with a color filter of a first color, and
a second of the optical sensors is aligned with a color filter of a second color, and
a transparent or translucent area between the optical sensors;
passing light from the first side of the substrate through the transparent or translucent area to the second side of the substrate;
by the optical sensors, generating signals that are responsive to light reflected from an object that is positioned over the sensor unit; and
by a circuit that is electrically connected the optical sensors:
receiving the signals from each of the plurality of optical sensors,
analyzing the signals to identify a color in the reflected light, the color being determined using the signals from each of the plurality of optical sensors and correlating to a surface color of an object,
determining whether the color in the reflected light corresponds to a predetermined surface color, and
in response to the color in the reflected light corresponding to the predetermined surface color, determining that an object of the predetermined surface color is positioned over the sensor unit.

24. The method of claim 23, wherein:
the optical sensors comprise:
the first optical sensor, aligned with a red color filter,
the second optical sensor, aligned with a blue color filter,
a third optical sensor, aligned with a green color filter, and
a fourth optical sensor, aligned with a white or gray reflecting layer; and
analyzing the signals to identify the color in the reflected light comprises determining whether the signal received from each of the optical sensors is low or high, and then determining the color of the reflected light as a color that corresponds to a combination of the color filters that are aligned with optical sensors that have emitted a high signal.

25. The method of claim 23, wherein:
the substrate further comprises a spacer layer that forms a second side of the substrate; and
passing the light from the first side of the substrate to the second side of the substrate further comprises passing the light through the spacer layer.

26. The method of claim 23, wherein each of the color filters is positioned in the sensor layer.

27. The method of claim 23, wherein each of the color filters is positioned in the spacer layer.

28. A method of identifying and detecting location of an object of a predetermined surface color positioned on a substrate, the method comprising:
providing a substrate that includes a sensor layer comprising a first side, an opposite second side, and an array of sensor units, wherein:
each of the sensor units comprises a plurality of optical sensors, including:
a first optical sensor of each sensor unit that is aligned with a color filter of a first color, and
a second optical sensor of each sensor unit that is aligned with a color filter of a second color, and
a transparent or translucent area is positioned between the optical sensors of each of the sensor unit; and
passing light from the first side of the substrate through the transparent or translucent areas of each of the sensor units to the second side of the substrate;
by any the optical sensors of the sensor units that detect light received through the second side of the substrate, generating signals that are responsive to the received light; and
by a circuit that is electrically connected the sensor units:
receiving the signals from the sensor units,
analyzing the signals to identify, for each sensor unit, whether the sensor unit has detected light received through the second side of the substrate,
for each sensor unit that has detected light:
analyzing the signals received from each of the plurality of optical sensors of the sensor unit to identify a color in the received light, wherein the color is identified using the signals from each of the plurality of optical sensors and correlates to a surface color of the object,
determining whether the color in the reflected light corresponds to a predetermined surface color, and
in response to the color in the reflected light corresponding to the predetermined surface color, determining that the object is positioned over that sensor unit on the second side of the substrate.

29. The method of claim 28, wherein:
the optical sensors of each sensor unit comprise:
the first optical sensor, aligned with a red color filter,
the second optical sensor, aligned with a blue color filter,
a third optical sensor, aligned with a green color filter, and
a fourth optical sensor, aligned with a white or gray reflecting layer; and
analyzing the signals received from each sensor unit to identify a color in the received light comprises determining whether the signal received from each of the optical sensors in that sensor unit is low or high, and then determining the color of the received light as a color that corresponds to a combination of the color filters that are aligned with optical sensors that have emitted a high signal.

30. The method of claim 28, wherein:
the substrate further comprises a spacer layer that forms a second side of the substrate; and
passing the light from the first side of the substrate to the second side of the substrate further comprises passing the light through the spacer layer.

31. The method of claim 30, wherein the color filters of at least some of the sensor units are positioned in the sensor layer.

32. The method of claim 30, wherein the color filters of at least some of the sensor units are positioned in the spacer layer.

* * * * *